United States Patent
Gill

(10) Patent No.: US 7,301,735 B2
(45) Date of Patent: Nov. 27, 2007

(54) HIGHER FLIP THRESHOLD STRUCTURE FOR IN-STACK BIAS LAYER

(75) Inventor: Hardayal Singh Gill, Palo Alto, CA (US)

(73) Assignee: Hitachi Global Technologies Netherlands B.V., Amsterdam (NL)

( * ) Notice: Subject to any disclaimer, the term of this patent is extended or adjusted under 35 U.S.C. 154(b) by 181 days.

(21) Appl. No.: 10/800,465

(22) Filed: Mar. 15, 2004

(65) Prior Publication Data

US 2005/0201024 A1  Sep. 15, 2005

(51) Int. Cl.
G11B 5/39 (2006.01)
(52) U.S. Cl. ................................. 360/324.12
(58) Field of Classification Search ............ 360/324.1, 360/324.11, 324.12, 324.2
See application file for complete search history.

(56) References Cited

U.S. PATENT DOCUMENTS

| | | | |
|---|---|---|---|
| 6,023,395 A | 2/2000 | Dill et al. ................. 360/113 |
| 6,114,719 A | 9/2000 | Dill et al. ................. 257/295 |
| 6,266,218 B1 | 7/2001 | Carey et al. ............ 360/324.12 |
| 6,438,026 B2 | 8/2002 | Gillies et al. ............... 365/158 |
| 6,473,279 B2 | 10/2002 | Smith et al. ............ 360/324.12 |
| 6,671,139 B2 | 12/2003 | Carey et al. ............ 360/324.12 |
| 6,680,832 B2 | 1/2004 | Fontana et al. .......... 360/324.2 |
| 6,738,236 B1* | 5/2004 | Mao et al. ............. 360/324.11 |
| 6,741,432 B2* | 5/2004 | Pinarbasi ................ 360/324.11 |
| 6,856,493 B2* | 2/2005 | Pinarbasi ................ 360/324.11 |
| 6,862,159 B2* | 3/2005 | Hasegawa ............... 360/324.11 |
| 6,888,705 B2* | 5/2005 | Fontana et al. ......... 360/324.12 |
| 2002/0154456 A1* | 10/2002 | Carey et al. ............ 360/324.11 |
| 2002/0159201 A1 | 10/2002 | Li et al. .................. 360/324.1 |
| 2002/0167768 A1* | 11/2002 | Fontana et al. .......... 360/324.2 |
| 2003/0137781 A1* | 7/2003 | Carey et al. .............. 360/324.2 |
| 2003/0143431 A1 | 7/2003 | Hasegawa .................. 428/692 |
| 2003/0174446 A1* | 9/2003 | Hasegawa .................. 360/319 |
| 2003/0179513 A1 | 9/2003 | Pinarbasi ................ 360/324.11 |
| 2003/0179514 A1 | 9/2003 | Pinarbasi ................ 360/324.11 |
| 2003/0184918 A1 | 10/2003 | Lin et al. .................... 360/314 |
| 2003/0197987 A1 | 10/2003 | Saito ..................... 360/324.12 |
| 2003/0206382 A1* | 11/2003 | Carey et al. ............ 360/324.12 |
| 2003/0235016 A1 | 12/2003 | Gill ....................... 360/324.12 |
| 2004/0008454 A1 | 1/2004 | Gill ....................... 360/324.12 |
| 2004/0120082 A1* | 6/2004 | Ikegami et al. ........ 360/324.11 |
| 2005/0088789 A1* | 4/2005 | Hou et al. .............. 360/324.12 |

* cited by examiner

Primary Examiner—William J Klimowicz
(74) Attorney, Agent, or Firm—Zilka-Kotab, PC

(57) ABSTRACT

A magnetoresistive sensor having an in stack bias layer extending beyond the track width of the sensor for improved free layer stability and resistance against amplitude flipping.

11 Claims, 5 Drawing Sheets

HIGHER FLIP THRESHOLD STRUCTURE FOR IN-STACK BIAS LAYER

FIELD OF THE INVENTION

The present invention relates to magnetoresitive sensors and more particularly to a giant magnetoresistive sensor, GMR having an improved free layer stability.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of a rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

A spin valve sensor is characterized by a magnetiresistive (MR) coefficient that is substantially higher than the MR coefficient of an anisotropic magnetoresistive (AMR) sensor. For this reason a spin valve sensor is sometimes referred to as a giant magnetoresistive (GMR) sensor. When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer). A pinning layer in a bottom spin valve is typically made of platinum manganese (PtMn). The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Sensors can also be categorized as current in plane (CIP) sensors or as current perpendicular to plane (CPP) sensors. In a CIP sensor, current flows from one side of the sensor to the other side parallel to the planes of the materials making up the sensor. Conversely, in a CPP sensor the sense current flows from the top of the sensor to the bottom of the sensor perpendicular to the plane of the layers of material making up the sensor.

Yet another type of sensor, somewhat similar to a CPP GMR sensor is a Tunnel Valve. A tunnel valve employs an electrically insulating spacer layer rather than a conductive spacer layer. A tunnel valve operates based on quantum mechanical tunneling of electrons through the insulating spacer layer. This tunneling is maximized when the magnetizations of the free and pinned layers are parallel to one another adjacent to the spacer layer.

The incredibly demanding data storage industry requires ever increasing data densities and data rates from storage products such as disk drives. One way to increase the amount of data tat can be stored on a disk is to increase the number of tracks per inch, or track density. This of course requires that magnetic sensors used to read those tracks must have ever decreasing track widths. However, the small tracks widths demanded in current products lead to free layer stability challenges. Although the magnetization of a free layer is free to rotate in the presence of a magnetic field, it must be biased in a desired direction, parallel with the ABS. This magnetic biasing is generally provided by a hard bias layer constructed of a high coercivity (high Hc) material, which may be formed either at each lateral side of the sensor or in stack (ie. below or above the free layer).

If the free layer magnetization switches direction, a condition referred to in the industry as "amplitude flipping", the head will become useless. The amount of magnetic field necessary to cause this undesirable flipping is called the flipping field. As one can see, higher flipping fields are desirable, because a higher flipping field means that the free layer is more resistant to flipping. However, this resistance to flipping is a function of the volume of the hard bias layer. Increasing the thickness of the hard bias layer can increase the resistance of the free layer to amplitude flipping. However, this increase in bias layer thickness is limited by the physical restraints on the sensor thickness. To maintain a high data rate, the number of bits per inch on a track of data must be maximized. Since the number of bits per inch is a function of the length of a bit, and therefore, a function of the total sensor thickness, the thickness of the sensor must be minimized.

As track widths shrink, free layers become more and more unstable and prone to flipping. As discussed above, one cannot simply increase the bias layer thickness to overcome this instability. Therefore, there remains a strong felt need for a mechanism for improving free layer biasing in a small track width sensor without sacrificing gap thickness budget. Such a mechanism would be preferably be useful in a CPP sensor design, since CPP sensor designs show great promise for use in future perpendicular recording systems in which bits of data are recorded in magnetic transitions formed perpendicular to the plane of the magnetic medium.

SUMMARY OF THE INVENTION

The present invention provides a sensor having an in stack bias layer for biasing a free layer of a magnetoresistive sensor. The sensor has first and second side walls defining a track width. A bias pinning layer formed adjacent said sensor bias layer extends laterally outward beyond said track width.

By extending laterally outward beyond said track width, the coercivity of the bias pinning layers can be greatly increased without making the bias pinning layers unnecessarily thick. The bias pinning layer can be constructed as a first and second magnetic layers separated from one another by a non-magnetic coupling layer.

By extending the pinning layers beyond the track width of the sensor effective bias layer pinning can be achieved with the first and second magnetic layers of the pinning layer being only about 20 to 40 angstroms thick.

The sensor may include one or more magnetic shields and at least one shield may be constructed to extend into a sensor thickness region to be formed adjacent to the sides of the sensor and to extend laterally outward therefrom. The use of an in stack bias layer allows the use of a shield that extends into sensor side regions. The use of such a shield advantageously prevents the sensor from picking up magnetic signals from adjacent tracks (ie. adjacent track reading).

BRIEF DESCRIPTION OF THE DRAWINGS

For a fuller understanding of the nature and advantages of this invention, as well as the preferred mode of use, reference should be made to the following detailed description read in conjunction with the accompanying drawings.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
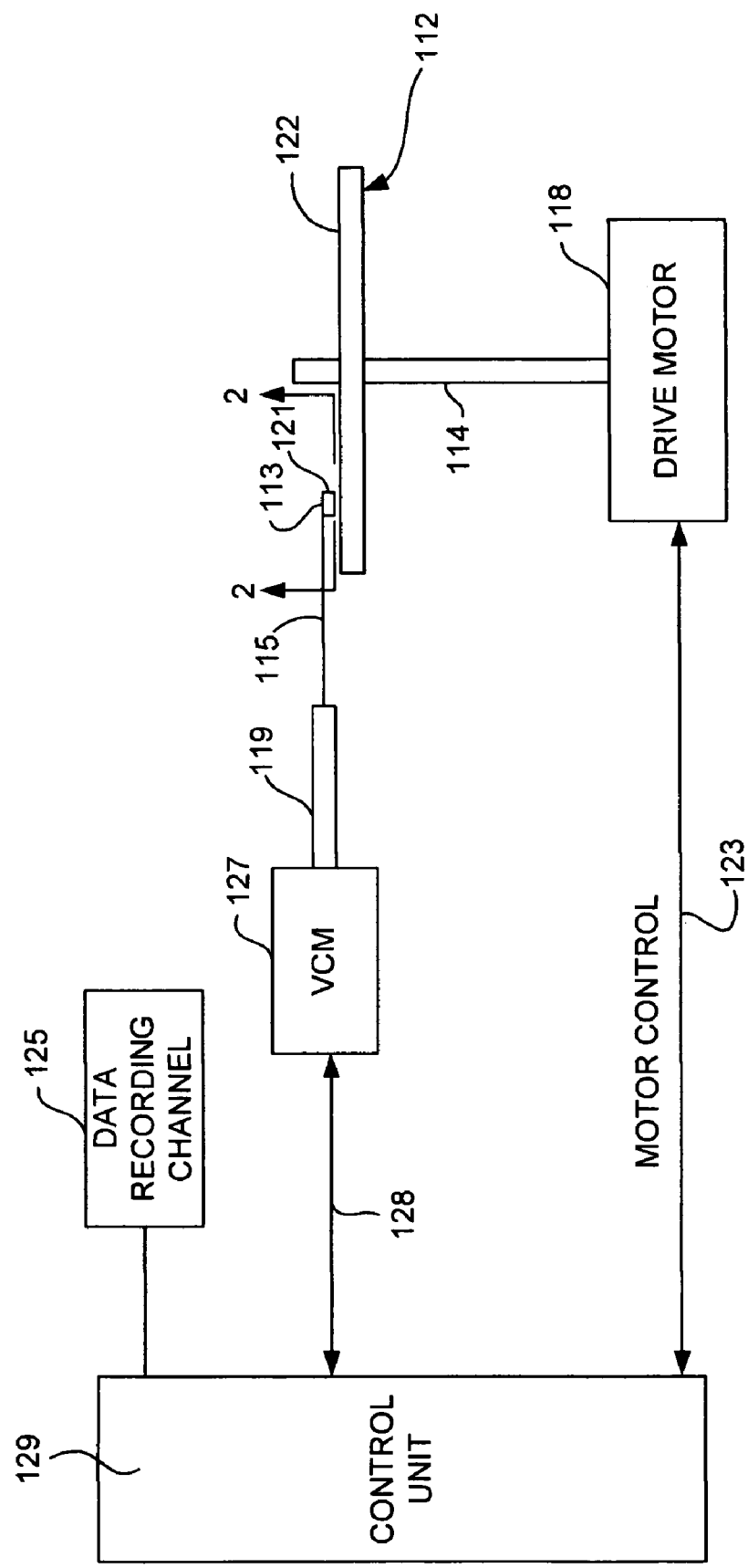
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
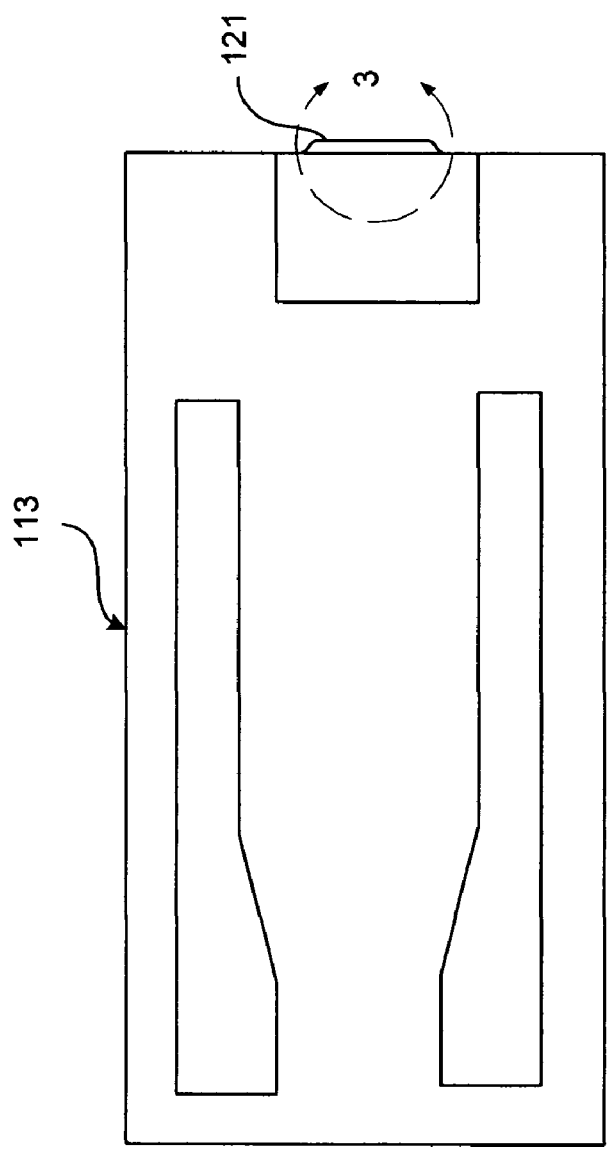
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
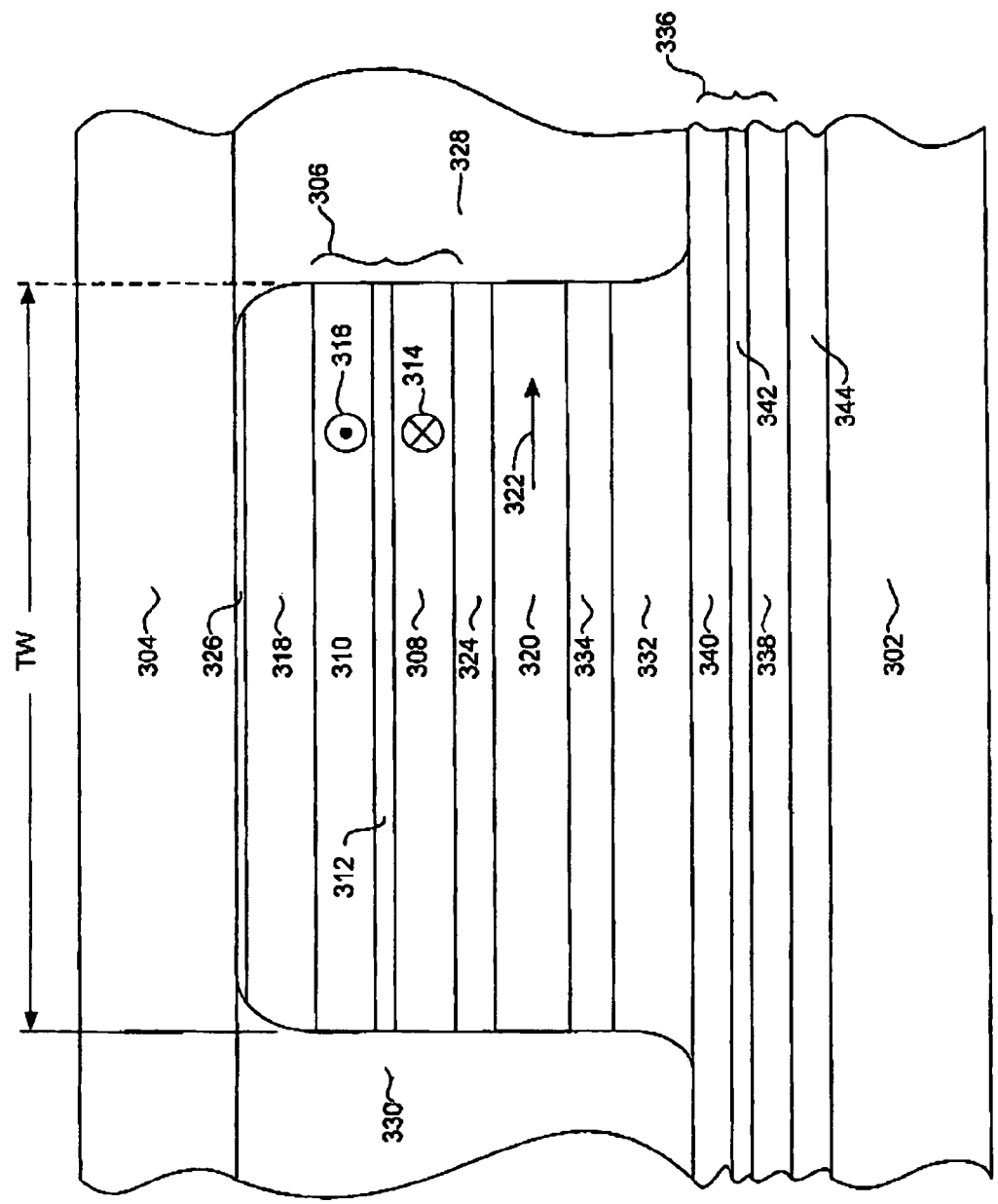
FIG. 3 is an ABS view of a magnetic sensor according to an embodiment of the present invention taken from circle 3 of FIG. 2.

With reference now to FIG. 3, according to a possible embodiment of the present invention, a current perpendicular to plane magnetoresistive sensor 300 includes first and second electrically conductive magnetic shields 302, 304. The magnetic shields prevent the sensor 300 from reading adjacent bits of data either up track or down track from the desired bit being written, and since the sensor 300 is a CPP sensor the shields 302, 304 also act as electrodes to conduct sense current to the sensor to be conducted through the sensor perpendicular to the planes of the layers making up the sensor.

The sensor includes a magnetic pinned layer 306, which can be an antiparallel pinned layer having first and second magnetic layers 308, 310 separated by a non-magnetic coupling layer 312, which may be for example Ru. The first and second magnetic layers 308, 310 can be constructed of several magnetic materials such as for example $Co_{50}Fe_{50}$ or some other suitable material, and have magnetizations that are pinned antiparallel to one another perpendicular to the ABS as indicated by symbols 314, 316. The pinned layer can be pinned by exchange coupling one of the magnetic layers 316, with a layer of antiferromagnetic material (AFM layer) 318. While antiferromagnetic layers in and of themselves do are not magnetic, when exchange coupled with a magnetic material, they very strongly pin the magnetization of that magnetic material. Alternatively, the pinned layer 306 could be self pinned, in which case it would be pinned without the assistance of an AFM layer. In that case the pinned layer would be pinned by a combination of intrinsic anisotropy of the magnetic layers 316, 314 along with magnetostriction of those layers 314, 316 combined with compressive stresses inevitably present in a completed sensor 300.

With continued reference to FIG. 3, the sensor 300 includes a free layer 320, constructed of a magnetic material such as for example NiFe or CoFe. The free layer 320 has a magnetization 322 that is biased in a direction parallel to the ABS and perpendicular to the directions of magnetization 314, 316 of the pinned layer 306. Although the magnetization 322 of the free layer 320 is biased it is also free to rotate in the presence of a magnetic field. A spacer layer 324 separates the free layer 320 from the pinned layer 306, and is preferably constructed of Cu. It should be pointed out that the present invention is applicable to use in a tunnel valve as well as a CIP GMR sensor. If the sensor 300 were to be a tunnel valve, the spacer layer 324 would be an electrically insulating material such as for example alumina.

A cap layer 326 such as Ta may be provided at the top of the sensor 300 to protect the sensor from corrosion during manufacture. The sensor has first and second laterally opposed sides that define a track width TW of the sensor. This track width is the width to which the sensor is able to read. As discussed above, the smallest possible track width TW is desired in order to increase the track pitch on the magnetic medium being read. Areas outside of the track width within a sensor thickness region can include first and second fill regions 328, 330 which can be for example alumina.

With continued reference to FIG. 3, magnetic biasing of the free layer 322 is achieved by an in stack bias layer 332 that is separated from the free layer 320 by a non magnetic spacer layer 334. The in stack bias layer 332 is preferably constructed of a high moment magnetic material such as CoFe, and as can be seen it is formed beneath the free layer within the track width region, rather than at the sides of the sensor within the fill regions 330, 338, (ie. in stack). Of course the bias layer 332 could be above the free layer if the free layer were on the top of the sensor. The spacer layer 334 is preferably an electrically conductive material such as for example Cu, Ru or Ta and could be 10 to 20 angstroms thick.

The magnetization of the bias layer 332 is set by a bias pinning layer 336, which may include first and second antiparallel coupled magnetic layers 338, 340 separated by a non-magnetic coupling layer 342 such as Ru which may be 4 to 8 angsroms thick. The antiparallel coupled magnetic layers are constructed of a high coercivity material such as CoPtCr, and have thicknesses that are as close as possible to one another. Making the thickness as close as possible to one another increases the coercivity of the bias pinning layer 336, because the coercivity of an antiparallel coupled structure is proportional to $1/(t_1-t_2)$, where $t_1$ and $t_2$ are the thicknesses of the first and second magnetic layers respectively. The bias pinning layer 336 may be constructed upon a seed layer 344, such as Cr, which may be 20 to 40 angtroms thick.

The coercivity of the pinning layer 336 (and therefore its ability to prevent free layer flipping) is proportional to the volume of its magnetic layers 340, 338. However, the thickness of these layers is constrained by the gap budget (ie. the distance between the shields 302, 304. According to the present invention, increased bias pinning coercivity is provided by extending the pinning layer 336 substantially beyond the track width TW of the sensor. In fact, by extending the pinned layer 336 beyond the track width of the sensor, the magnetic layers 338, 340 can be made as thin as 20 to 40 angstroms each.

Figure 4:
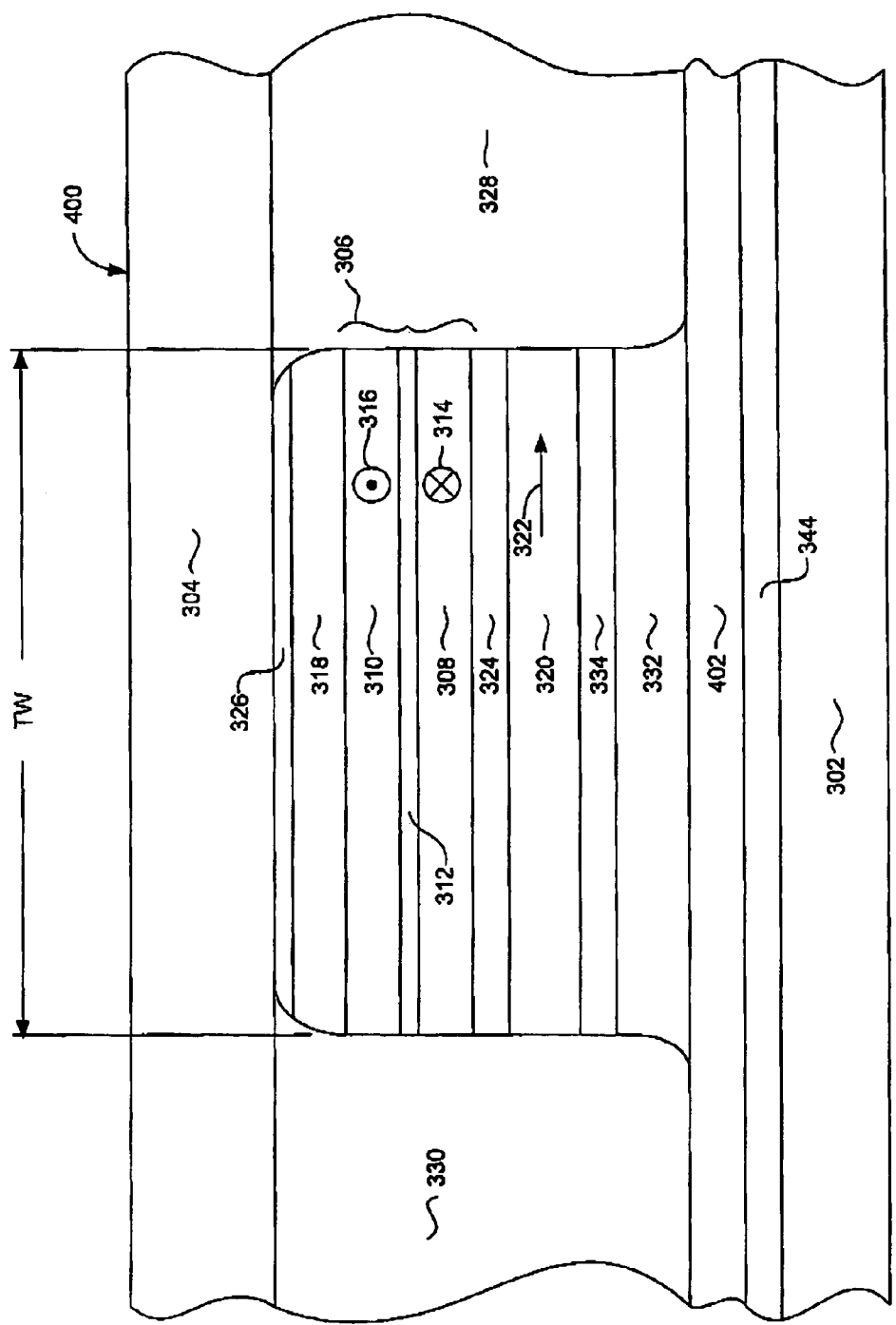
FIG. 4 is an ABS view of a magnetic sensor according to an alternate embodiment of the invention.

With reference now to FIG. 4, an alternate embodiment of the invention includes a sensor 400 having a bias pinning layer 402 formed as a single layer rather than an AP coupled pinning layer. In this embodiment, the pinning layer 402 is preferably constructed of CoPtCr. This embodiment provides a pinning layer that is easier to manufacture than the previously described embodiment and may be used in designs where such a single layer pinning layer would provide sufficient pinning. As with the previously described embodiment, the pinning layer 402 extends beyond the track width region TW of the sensor 400. The pinning layer may be formed upon a seed layer 344 such as Cr and is preferably exchange coupled with a bias layer 332. The bias layer 332 is preferably formed of a high moment magnetic material and is separated from the free layer 320 by a spacer layer 334.

Figure 5:
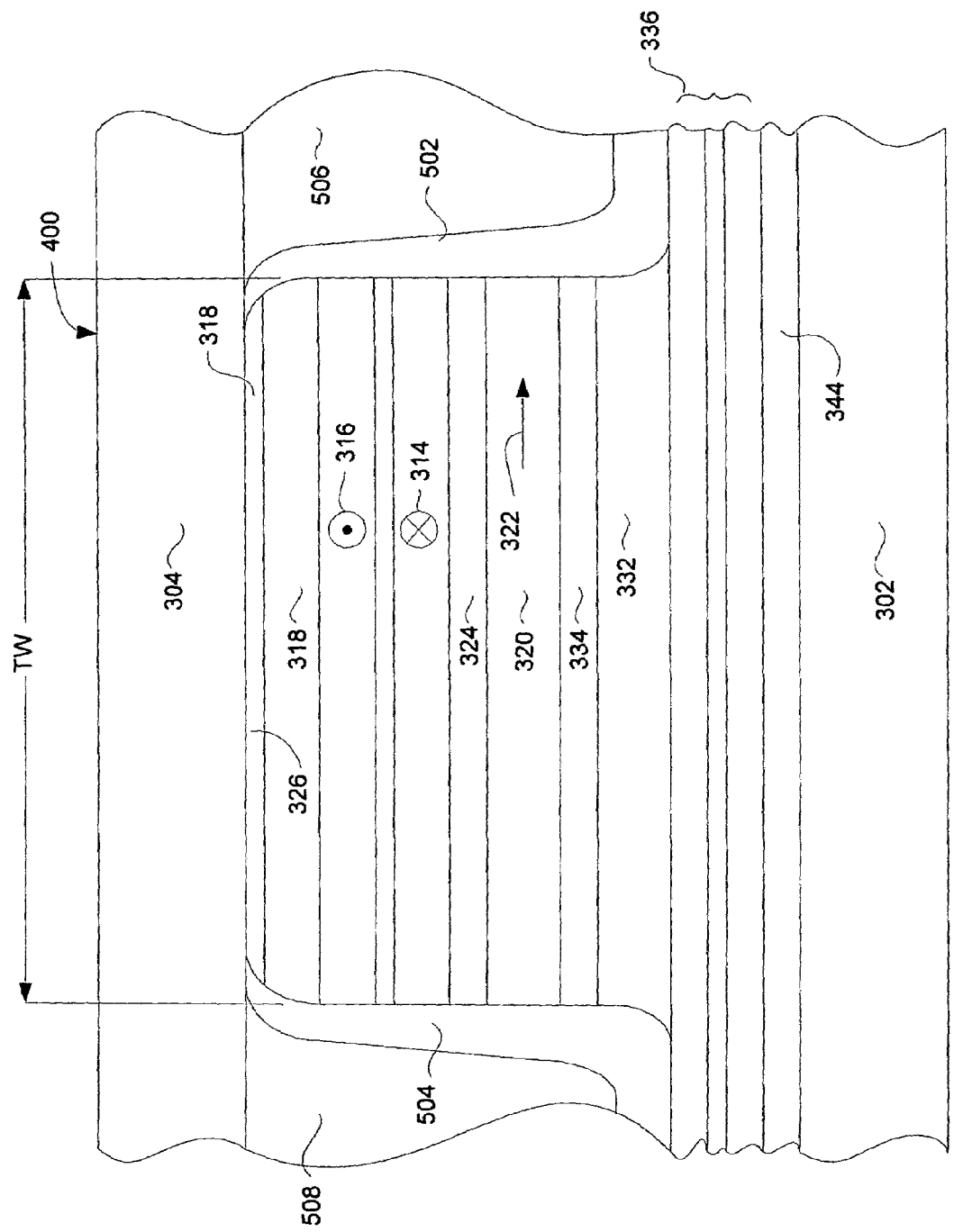
FIG. 5 is an ABS view of a magnetic sensor according to yet another embodiment of the invention.

With reference now to FIG. 5, yet another embodiment of the invention includes electrically insulating side walls 502, 504 formed at each of the laterally opposed side walls of the sensor 500. In this embodiment magnetic shield material 506, 508 extends into the sensor thickness region extending laterally outward from the side walls 502, 504. The shield material 506, 508, is preferably formed as an extension of one of the shields such as the top shield 304 and advantageously acts to prevent the sensor from reading bits of data from adjacent tracks. It should be pointed out that the use of such side shields 506, 508 only becomes practical when employing an in stack bias structure such as that of the present invention. If the bias layers were contiguous bias layers extending from the sides of the sensor as is commonly seen today's read sensors, there would be no room for such side shields 506, 508. Therefore, providing a functional in stack bias layer that allows strong biasing and prevents amplitude flipping, provides the added advantage of allowing the incorporation of side shields 506, 508.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A current in plane magnetoresistive sensor, comprising:
   a magnetic free layer having a magnetization biased parallel to an air bearing surface (ABS);

a magnetic pinned layer having a magnetization pinned perpendicular to said ABS;

a non-magnetic spacer layer disposed between said free layer and said pinned layer;

said free layer, pinned layer, and spacer layer having first and second laterally opposed sides defining a track width;

a magnetic bias layer formed adjacent said free layer within said track width;

a bias pinning layer formed adjacent said bias layer opposite said free layer within said track width, said bias pinning layer extending laterally outward substantially beyond said track width;

wherein said bias pinning layer further comprises first and second magnetic layers formed of a high coercivity magnetic material, and separated from one another by non-magnetic coupling layer, said first and second layers of high coercivity material having magnetizations anti-parallel coupled with one another.

2. A magnetoresistive sensor as in claim 1 wherein said first and second high coercivity magnetic material layers comprise CoPtCr.

3. A magnetoresistive sensor as in claim 1 wherein said first and second high coercivity material layers each have a thickness of between 20 and 40 angstroms.

4. A magnetoresistive sensor as in clam 1, wherein said non-magnetic coupling layer comprises Ru.

5. A magnetoresistive sensor as recited in claim 1 further comprising a seed layer formed adjacent said bias pinning layer opposite said bias layer.

6. A magnetoresistive sensor as in claim 5 wherein said seed layer comprises Cr.

7. A magnetoresistive sensor as in claim 5 wherein said seed layer comprises Cr and wherein said seed layer has a thickness of from 20 to 40 angstroms.

8. A magnetoresistive sensor as in claim 1 further comprising first and second electrically insulating side walls formed at said first and second sides defined by said free layer, said pinned layer, and said spacer layer.

9. A magnetoresistive sensor as in claim 8 wherein said first and second electrically insulating side walls comprise alumina (Al2O3).

10. A magnetoresistive sensor as in claim 8, further comprising at least one magnetic shield extending into a sensor stack height region, and being formed adjacent a portion of said electrically insulating side walls and extending laterally outward therefrom.

11. A magnetoresistive sensor as in claim 1 wherein said first and second magnetic layers of said bias pinning layer have substantially the same magnetic thickness.

* * * * *